(12) United States Patent
Miyamoto et al.

(10) Patent No.: US 7,312,514 B2
(45) Date of Patent: Dec. 25, 2007

(54) HIGH-PERMITTIVITY INSULATION FILM, THIN FILM CAPACITY ELEMENT, THIN FILM MULTILAYER CAPACITOR, AND PRODUCTION METHOD OF THIN FILM CAPACITY ELEMENT

(75) Inventors: Yuki Miyamoto, Chuo-ku (JP); Yukio Sakashita, Chuo-ku (JP)

(73) Assignee: TDK Corporation, Tokyo (JP)

( * ) Notice: Subject to any disclaimer, the term of this patent is extended or adjusted under 35 U.S.C. 154(b) by 25 days.

(21) Appl. No.: 10/546,834

(22) PCT Filed: Feb. 24, 2004

(86) PCT No.: PCT/JP2004/002118

§ 371 (c)(1),
(2), (4) Date: Aug. 25, 2005

(87) PCT Pub. No.: WO2004/077566

PCT Pub. Date: Sep. 10, 2004

(65) Prior Publication Data

US 2006/0091494 A1    May 4, 2006

(30) Foreign Application Priority Data

Feb. 27, 2003    (JP)    ............................. 2003-051838

(51) Int. Cl.
*H01L 29/00* (2006.01)

(52) U.S. Cl. ............ 257/532; 257/535; 438/957; 438/3

(58) Field of Classification Search ............ None
See application file for complete search history.

(56) References Cited

U.S. PATENT DOCUMENTS 5,780,886 A * 7/1998 Yamanobe ............... 257/295
5,989,927 A * 11/1999 Yamanobe ............... 438/3
6,891,714 B2 * 5/2005 Sakashita ............... 361/306.3
6,958,900 B2 * 10/2005 Sakashita ............... 361/306.3

(Continued)

FOREIGN PATENT DOCUMENTS

JP    A 56-144523    11/1981

(Continued)

OTHER PUBLICATIONS

Kojima et al., "Novel Candidate of x-axis-oriented BLSF Thin Films for High-Capacitance Condenser," Mat. Res. Soc. Symp. Proc., vol. 748, Materials Research Society, 2003.

(Continued)

*Primary Examiner*—Leonardo Andujar
(74) *Attorney, Agent, or Firm*—Oliff & Berridge, PLC

(57) ABSTRACT

A dielectric thin film 8, comprising a first bismuth layer-structured compound layer 8a expressed by a composition formula of $(Bi_2O_2)^{2+}(A_{m-1} B_m O_{3m+1})^{2-}$ or $Bi_2 A_{m-1} B_m O_{3m+3}$, wherein "m" is a positive number, "A" is at least one element selected from Na, K, Pb, Ba, Sr, Ca and Bi, and "B" is at least one element selected from Fe, Co, Cr, Ga, Ti, Nb, Ta, Sb, V, Mo and W. Between the first bismuth layer-structured compound layer 8a and a lower portion electrode 6, a second bismuth layer-structured compound layer 8b including bismuth in excess of that in the composition formula of said first bismuth layer-structured compound layer 8a.

25 Claims, 3 Drawing Sheets

U.S. PATENT DOCUMENTS

2002/0153543 A1* 10/2002 Kijima ............... 257/296

FOREIGN PATENT DOCUMENTS

| | | |
|---|---|---|
| JP | A 1-244656 | 9/1989 |
| JP | A 5-251655 | 9/1993 |
| JP | A 5-335173 | 12/1993 |
| JP | A 5-335174 | 12/1993 |
| JP | 0 732 422 A2 | 9/1996 |
| JP | A 8-306231 | 11/1996 |
| JP | 0 810 666 A1 | 12/1997 |
| JP | A 10-56142 | 2/1998 |
| JP | A 10-200059 | 7/1998 |
| JP | 0 910 120 A2 | 4/1999 |
| JP | A 11-121703 | 4/1999 |
| JP | A 11-214245 | 8/1999 |
| JP | A 2000-124056 | 4/2000 |
| JP | A 2000-169297 | 6/2000 |

OTHER PUBLICATIONS

Kojima et al., "Capacitor Applications of x-Axis-Oriented Bismuth Layer Structured Ferroelectric Thin Films," The 27th Annual Cocoa Beach Conference & Exposition on Advanced Ceramics & Composites, Ceramics and Electronics in the New Horizon, Jan. 26-31, 2003.

The 5th International Meeting of Pacific Rim Ceramic Societies Incorporating the 16th Fall Meeting of the Ceramic Society of Japan, pp. 35, 2003.

The 5th International Meeting of Pacific Rim Ceramic Societies Incorporating the 16th Fall Meeting of the Ceramic Society of Japan, pp. 111, 2003.

MRS2002 Program exhibit Guide, Dec. 2-6, 2002.

Extended Abstracts, The Japan Society of Applied Physics and Related Societies, the 50th Spring Meeting, 2003.

Extended Abstracts, The Japan Soceity of Applied Physics, the 64th Autumn Meeting, 2003.

* cited by examiner

FIG. 2

APPLYING SECOND BISMUTH LAYER-STRUCTURED COMPOUND LAYER
↓
DRYING
↓
PRELIMINARY FIRING (DEGRADING ORGANICS)
↓
CRYSTALLIZING
↓
APPLYING FIRST BISMUTH LAYER-STRUCTURED COMPOUND LAYER
↓
DRYING
↓
PRELIMINARY FIRING (DEGRADING ORGANICS)
↓
CRYSTALLIZING

HIGH-PERMITTIVITY INSULATION FILM, THIN FILM CAPACITY ELEMENT, THIN FILM MULTILAYER CAPACITOR, AND PRODUCTION METHOD OF THIN FILM CAPACITY ELEMENT

TECHNICAL FIELD

The present invention relates to a high-permittivity insulation film, a thin film capacity element, a thin film multilayer capacitor and a production method of the thin film multilayer capacitor.

BACKGOUND ART

In recent years, in the field of electronic devices, there have been demands for a furthermore compact capacitor element as an essential circuit element in a variety of electronic circuits along with electronic circuits becoming higher in density and more highly integrated.

For example, a thin film capacitor using a single-layer dielectric thin film is behind in making a compact integrated circuit with a transistor or other active element, which has been a factor of hindering realization of an ultra-high integrated circuit. It was a low permittivity of a dielectric material to be used that has hindered attaining of a compact thin film capacitor. Accordingly, it is significant to use a dielectric material having a high permittivity to realize a more compact thin film capacitor with a relatively high capacity.

Also, in recent years, a conventional multilayer film of $SiO_2$ and $Si_3N_4$ has become hard to respond to a capacitor material for a DRAM of the next generation (gigabit generation) in terms of capacity density, and a material system having a higher permittivity has gathered attention. In such a material system, an application of TaOx ($\epsilon=30$ or smaller) has been mainly studied but development of other materials has come to be actively pursued.

On the other hand, as a dielectric material having a relatively high permittivity, $(Ba, Sr)TiO_3$ (BST) and $Pb(Mg_{1/3}Nb_{2/3})O_3$ (PMN) are known.

It can be considered that it is possible to attain a compact body when composing a thin film capacity element by using a dielectric material of this kind.

However, when using dielectric materials of this kind, the permittivity declined as the dielectric film became thinner in some cases. Also, a leakage property and a breakdown voltage were deteriorated due to apertures generated on the dielectric film as the film became thinner in some cases. Furthermore, it was liable that the dielectric film to be formed had poor surface smoothness and a permittivity change rate against a temperature was deteriorated. Note that due to a large effect by lead compounds, such as PMN, on the environment, a high capacity capacitor not containing lead has been desired in recent years.

On the other hand, to realize a more compact multilayer ceramic capacitor with a larger capacity, it is desired that a thickness of one dielectric layer is made as thin as possible (a thinner layer) and the number of dielectric layers at a predetermined size is increased as much as possible (an increase of stacked layers).

However, for example, when producing a multilayer ceramic capacitor by a sheet method (a method of forming a dielectric green sheet layer on a carrier film by using a dielectric layer paste by the doctor blade method, etc., printing an internal electrode layer paste to be a predetermined pattern thereon, then, releasing them one by one and stacking the same), the dielectric layer could not be made thinner than ceramic material powder. Furthermore, it was difficult to make the dielectric layer thin, for example, as 2 μm or thinner because of problems of short-circuiting and breaking of internal electrode, etc. due to a defective dielectric layer. Also, when a thickness of one dielectric layer was made thinner, the number of stacked layers was also limited. Note that the same problem remained in the case of producing a multilayer ceramic capacitor by the printing method (a method of alternately printing a dielectric layer paste and an internal electrode layer paste for a plurality of times on a carrier film, for example, by using the screen printing method, then, removing the carrier film).

Due to the above reasons, there was a limit in making the multilayer ceramic capacitor more compact and higher in capacity. Thus, a variety of proposals have been made to solve the problem (for example, the Japanese Patent Publication No. 2000-124056, the Japanese Patent Publication No. 11-214245, the Japanese Patent Publication No. 56-144523, the Japanese Patent Publication No. 5-335173, and the Japanese Patent Publication No. 5-335174, etc.).

These publications disclose methods of producing a multilayer ceramic capacitor formed by alternately stacking dielectric thin films and electrode thin films by using a variety of thin film forming methods, such as the CVD method, evaporation method and sputtering method.

However, dielectric thin films formed by the methods described in the patent articles had poor surface smoothness, and short-circuiting of electrodes arose when stacking too much, so that those having 12 or 13 stacked layers or so were able to be produced at most. Therefore, even when the capacitor could be made compact, a higher capacity could not be attained.

Note that as described in the non-patent article 1 ["Particle Orientation of Ferroelectric Ceramic having Bismuth Layer Structure and Application Thereof to Piezoelectric and Pyroelectric Material" by Tadashi Takenaka, pp. 23 to 77 in chapter 3 of Kyoto University Doctor of Engineering Thesis (1984)], it is known that a bulk bismuth layer-structured compound dielectric obtained by the sintering method is composed of a composition expressed by a composition formula of $(Bi_2O_2)^{2+} (A_{m-1} B_m O_{3m+1})^{2-}$ or $Bi_2A_{m-1} B_m O_{3m+3}$, wherein "m" is a positive number from 1 to 8, "A" is at least one element selected from Na, K, Pb, Ba, Sr, Ca and Bi, and "B" is at least one element selected from Fe, Co, Cr, Ga, Ti, Nb, Ta, Sb, V, Mo and W.

However, in this article, nothing was disclosed on under what condition (for example, a relationship of a substrate surface and a c-axis orientation degree of a compound) when making the composition expressed by the above composition formula thinner (for example 1 μm or thinner), a thin film capable of giving a relatively high permittivity and a low loss, having an excellent leakage property, improved breakdown voltage, excellent temperature characteristics of permittivity, and excellent surface smoothness even when made to be thin could be obtained.

The present inventors have developed a thin film capacity element composition disclosed in PCT/JP02/08574 and filed before. Also, as a result of carrying on further experiments, they found that the c-axis orientation degree of the compound could be still improved by making Bi contained in excess of a stoichiometric composition of the bismuth layer-structured compound, and filed before (The Japanese Patent Application No. 2003-012086 and The Japanese Patent Application No. 2003-012088).

Also, the article [2001 Journal of Applied Physics Vol. 40 (2001) pp. 2977 to 2982, Part 1, No. 4B, April 2001] reports that the c-axis orientation degree can be improved by adding Bi excessively in a dielectric thin film of $(Bi,La)_4Ti_3O_{12}$. However, this article only discloses a bismuth layer-structured compound expressed by a composition formula $(Bi_2O_2)^{2+}$ $(A_{m-1} B_m O_{3m+1})^{2-}$ or $Bi_2A_{m-1} B_m O_{3m+3}$, wherein "m" is an odd number. Also, in this article, the excessive adding quantity of Bi is small as 2.5 to 7.5 mol % (0.4 mol or smaller with respect to the stoichiometric composition), which was proved to be insufficient to improve the leakage current resistant property according to an experiment by the present inventors.

Also, as in the above article, in the bismuth layer-structured compound film added with an excessive amount of Bi, the leakage current resistance characteristic can be improved by improving the c-axis orientation degree, but the present inventors found that the permittivity declines comparing with a bismuth layer-structured compound, wherein an excessive amount of Bi is not added.

Furthermore, the Japanese Unexamined Patent Publication No. 11-121703 discloses a technique of suppressing reaction with a base material and preventing hindering of electric connection by forming an oxide layer including bismuth as a buffer layer between the bismuth layer-structured compound layer and the lower portion electrode. However, the buffer layer in the article is not a bismuth layer-structured compound film including an excessive amount of bismuth, and technical thought of improving the c-axis orientation by forming the buffer layer is not given.

DISCLOSURE OF THE INVENTION

The present invention was made in consideration of the above circumstances and has as an object thereof to provide a high-permittivity insulation film, a thin film capacity element, a thin film multilayer capacitor and a production method of the thin film capacitor element, wherein a c-axis orientation is high, leakage current resistant property is particularly excellent, and the permittivity as a whole can be improved.

The present inventors have been committed themselves to study a material and crystal structure of a dielectric thin film to be used for a capacitor, found that by using a bismuth layer-structured compound having a specific composition and making a c-axis ([001] direction) of the bismuth layer-structured compound vertical with respect to the substrate surface when composing the dielectric thin film as a thin film capacitor element composition, that is, by forming a c-axis orientation film (a thin film normal line is in parallel with the c-axis) of the bismuth layer-structured compound on the substrate surface, it was possible to provide a thin film capacity element compound capable of giving a relatively high permittivity and a low loss (tan δ is low), having an excellent leakage property, improved breakdown voltage, excellent temperature characteristics of the permittivity, and excellent surface smoothness even when made to be thin; and a thin film capacity element using the same. Also, it was found that by using such a thin film capacity element composition as a dielectric thin film, the number of stacked layers could be increased and a compact thin film multilayer capacitor capable of giving a relatively high capacity could be provided. Furthermore, it was found that by using such a composition as a high-permittivity insulation film, application to other use objects than a thin film capacity element became also possible.

Furthermore, the present inventors found that as a result of excessively including Bi in a bismuth layer-structured compound in a predetermined excessive quantity with respect to a stoichiometric composition of the bismuth layer-structured compound in a composition, the leakage current resistant property could be improved, and furthermore, by placing a second bismuth layer-structured compound on a surface of a lower electrode, the c-axis orientation degree could be furthermore improved.

Furthermore, from the fact that a bismuth layer-structured compound added with excessive bismuth had a declined permittivity than that of a bismuth layer-structured compound of a logical composition, the present inventors found that by combining the bismuth layer-structured compound added with excessive bismuth and the bismuth layer-structured compound of the logical composition, the leakage current resistant property could be improved and the permittivity could be improved as a whole, and completed the present invention.

Namely, a high-permittivity insulation film according to the present invention is a high-permittivity insulation film, comprising at least a first bismuth layer-structured compound layer expressed by a composition formula of $(Bi_2O_2)^{2+}(A_{m-1} B_m O_{3m+1})^{2-}$ or $Bi_2 A_{m-1} B_m O_{3m+3}$, wherein "m" is a positive number, "A" is at least one element selected from Na, K, Pb, Ba, Sr, Ca and Bi, and "B" is at least one element selected from Fe, Co, Cr, Ga, Ti, Nb, Ta, Sb, V, Mo, W and Mn, and a second bismuth layer-structured compound layer to be stacked with said first bismuth layer-structured compound layer, including bismuth in excess of that in said composition formula of said first bismuth layer-structured compound layer.

According to the high-permittivity insulation film according to the present invention, the second bismuth layer-structured compound layer includes bismuth excessively, so that the leakage resistant property is improved in the high-permittivity insulation film. Also, the dielectric thin film also has the first bismuth layer-structured compound layer close to the logical composition, wherein bismuth is not excessive, and the layer has a higher permittivity than that of the layer 8b including excessive bismuth. As a result, the permittivity of the dielectric thin film as a whole is improved and the capacitance improves.

Accordingly, it is possible to provide a high-permittivity insulation film having a particularly excellent leakage current resistant property and capable of improving a permittivity in total in the present invention. Furthermore, by arranging the second bismuth layer-structured compound layer on the surface of the lower portion electrode, the c-axis orientation degree can be furthermore improved. The high-permittivity insulation film is preferably used as a dielectric film in a thin film capacity element or a dielectric film in a thin film multilayer capacitor. Note that the high-permittivity insulation film of the present invention can be used, for example, as a gate insulation film of a semiconductor apparatus and an intermediate insulation film between a gate electrode and a floating gate, etc. other than the thin film dielectric film of a thin film capacity element or a capacitor.

Note that the "thin film" mentioned in the present invention means a film of a material having a thickness of several Å to several μm or so formed by a variety of thin film forming methods and excludes a bulk (block) of a thick film having a thickness of several hundreds of μm or thicker formed by the sintering method. The thin film includes a continuous film which continuously covers a predetermined region and a discontinuous film which covers discontinuously at any intervals. The thin film may be formed at a part of or all over a substrate.

Preferably, the first bismuth layer-structured compound layer and the second bismuth layer-structured compound layer are the same bismuth layer-structured compound layer having a same logical composition formula except that a content of bismuth in the second bismuth layer-structured compound layer is larger than that in the first bismuth layer-structured compound layer. Layers having the same logical composition formula exhibit a more excellent bonding property on a boundary surface of stacking and improved c-axis orientation degree. Note that the layers may be bismuth layer-structured compound layers having different formulas in the present invention.

The bismuth excessive amount included in the second bismuth layer-structured compound layer against the composition formula of the first bismuth layer-structured compound layer is larger than 0, preferably 0.1 mole folds or larger and 0.5 mole folds or smaller, and more preferably 0.1 to 0.4 mole folds. When being in the range, the c-axis orientation degree of the second bismuth layer-structured compound layer improves, that of the first bismuth layer-structured compound layer also improves, and the leakage resistant property improves.

Preferably, a thickness of said second bismuth layer-structured compound layer is thinner than a thickness of said first bismuth layer-structured compound layer. In this case, the thickness of said second bismuth layer-structured compound layer is 1 nm or thicker and thinner than 300 nm, more preferably 5 to 200 nm, and particularly preferably 10 to 100 nm. The second bismuth layer-structured compound layer functions as a buffer layer of the first bismuth layer-structured compound layer and, when the thickness is too thin, the function of improving the c-axis orientation degree and improving the leakage resistant property tend to deteriorate. Also, when a thickness of the second bismuth layer-structured compound layer is too thick, the thickness of the first bismuth layer-structured compound layer has to be thinner to respond to the demand for a thinner layer, and the permittivity in total tends to decline.

In the present invention, it is preferable that the c-axis of the bismuth layer-structured compound is vertical with respect to the substrate surface, namely it is particularly preferable that the c-axis orientation degree of the bismuth layer-structured compound is 100%, but it does not always have to be 100%.

It is preferable that the c-axis orientation degree of the second bismuth layer-structured compound is 80% or more, more preferably 90% or more. Also, the c-axis orientation degree of the first bismuth layer-structured compound is 80% or more, more preferably 90% or more. By improving the c-axis orientation degree of these layers, the leakage resistant property is improved in the high-permittivity insulation film.

The second bismuth layer-structured compound layer may be composed of a single layer or a plurality of layers. In the case of composing of a plurality of layers, it may be composed of the same layers or composed of a plurality of layers having different bismuth excessive quantities. Alternately, the second bismuth layer-structured compound layer may be composed of layers having a gradually changing bismuth excessive quantity along the layer thickness direction.

In the present invention, "m" in the composition formula is not particularly limited but it is preferably any one of 3, 4 and 5. When in a composition of m=3, 4 or 5, effects of the present invention are particularly enhanced.

In the present invention, the first bismuth layer-structured compound layer and/or the second bismuth layer-structured compound layer may furthermore include a rare earth element (at least one element selected from Sc, Y, La, Ce, Pr, Nd, Pm, Sm, Eu, Gd, Tb, Dy, Ho, Er, Tm, Yb and Lu). By including the rare earth element, the leakage property can be furthermore improved.

A thin film multilayer capacitor according to the present invention is a thin film multilayer capacitor, wherein a plurality of dielectric thin films and internal electrode thin films are alternately stacked on a substrate, wherein said dielectric thin film is composed of the high-permittivity insulation film as set forth in any one of the above.

The thin film capacity element is not particularly limited, and a condenser (for example, a single layer thin film condenser and a multilayer thin film multilayer condenser, etc.) and a capacitor (for example, for a DRAM, etc.), etc. having a conductor-insulator-conductor structure may be mentioned.

Preferably, said second bismuth layer-structured compound layer is stacked on a surface of said lower portion electrode, and said first bismuth layer-structured compound layer is stacked on a surface of said second bismuth layer-structured compound layer. It is relatively difficult to form a bismuth layer-structured compound layer having a high c-axis orientation degree on an electrode surface of a material, wherein crystal does not grow epitaxially, however, according to the second bismuth layer-structured compound layer added with excessive bismuth, a bismuth layer-structured compound layer having a high c-axis orientation degree can be formed.

The c-axis in the second bismuth layer-structured compound layer is oriented vertically with respect to the surface of the lower portion electrode. A c-axis in the first bismuth layer-structured compound layer is also oriented vertically with respect to the surface of the lower portion electrode by following the second bismuth layer-structured compound layer, and the orientation degree is intensified as well.

Preferably, a thickness of the dielectric thin film is 1 to 1000 nm, and more preferably 10 to 500 nm. In the present invention, even when a thickness of the dielectric thin film is made thin, the c-axis orientation degree is high, the leakage current resistant property is particularly excellent and, moreover, the permittivity can be improved in total.

A thin film multilayer capacitor according to the present invention is a thin film multilayer capacitor, wherein a plurality of dielectric thin films and internal electrode thin films are alternately stacked on a substrate, wherein said dielectric thin film is composed of the high-permittivity insulation film as set forth in any one of the above.

Preferably, said second bismuth layer-structured compound layer is stacked on a surface of said lower portion electrode, and said first bismuth layer-structured compound layer is stacked on a surface of said second bismuth layer-structured compound layer. It is relatively difficult to form a bismuth layer-structured compound layer having a high c-axis orientation degree on an electrode surface of a material, wherein crystal does not grow epitaxially, however, according to the second bismuth layer-structured compound layer added with excessive bismuth, a bismuth layer-structured compound layer having a high c-axis orientation degree can be formed.

The c-axis in the second bismuth layer-structured compound layer is oriented vertically with respect to the surface of the lower portion electrode. A c-axis in the first bismuth layer-structured compound layer is also oriented vertically with respect to the surface of the lower portion electrode by following the second bismuth layer-structured compound layer, and the orientation degree is intensified as well.

Preferably, a thickness of the dielectric thin film is 1 to 1000 nm, and more preferably 10 to 500 nm. In the present invention, even if the thickness of the dielectric thin film is made thin, the c-axis orientation degree is high, the leakage current resistant property is particularly excellent and, moreover, the permittivity can be improved in total.

A production method of the thin film capacity element according to the present invention includes the steps of:

forming said second bismuth layer-structured compound layer on a surface of said lower portion electrode; and forming said first bismuth layer-structured compound layer on a surface of said second bismuth layer-structured compound layer.

A method of forming the second bismuth layer-structured compound layer is not particularly limited and a variety of thin film formation methods can be applied, but it is preferable to use a solution method. Namely, preferably, a solution for composing said second bismuth layer-structured compound layer is applied on a surface of said lower portion electrode to form a coating film, so that a content of Bi in said bismuth layer-structured compound becomes excessive; then, said coating film is fired to form said second bismuth layer-structured compound layer; after that, said first bismuth layer-structured compound layer is formed. By using the solution method, the second bismuth layer-structured compound layer including excessive bismuth can be easily formed.

Note that the method for forming the first bismuth layer-structured compound layer is not particularly limited and a variety of thin film formation methods can be applied. But it is preferable to produce by the same method as that of the second bismuth layer-structured compound layer. By using the same production method, the production steps may be simplified.

Preferably, after forming said coating film on a surface of said lower portion electrode, said coating film is dried, then, said coating film is preliminarily fired at a temperature of not crystallizing the coating film, after that, said coating film is fired. By performing the preliminary firing, coating can be repeated and crystallization in the firing step after that becomes easy.

Preferably, a temperature of firing said coating film is 700 to 900° C., which is a temperature of crystallizing said coating film. Preferably, the temperature of firing said coating film is the room temperature (25° C.) to 400° C., and more preferably 50° C. to 300° C. preferably, a temperature of preliminary firing of the coating film is 300° C. to 500° C.

BRIEF DESCRIPTION OF DRAWINGS

FIG. 2 is a flowchart showing the production steps of the thin film capacitor shown in FIG. 1.

BEST MODE FOR CARRYING OUT THE INVENTION

Figure 1A:
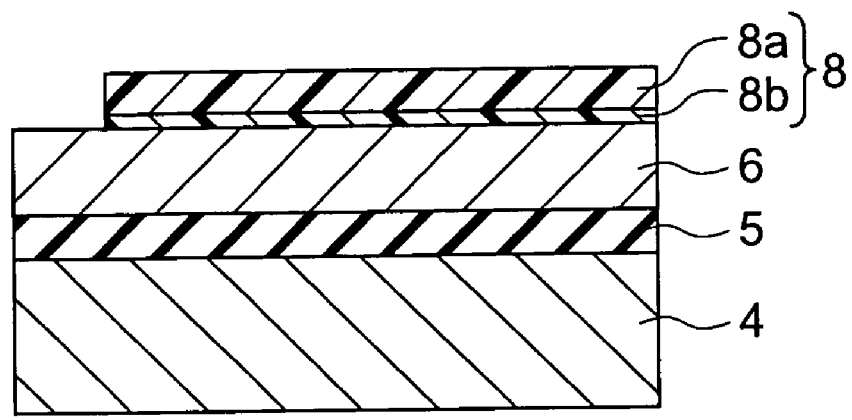
FIG. 1A and FIG. 1B are schematic sectional views showing production steps of a thin film capacitor according to an embodiment of the present invention.

Below, the present invention will be explained in detail based on embodiments shown in the drawings.

First Embodiment

In the present invention, a thin film capacitor, wherein a dielectric thin film is formed by a single layer, will be explained as an example of a thin film capacity element.

Figure 1B:
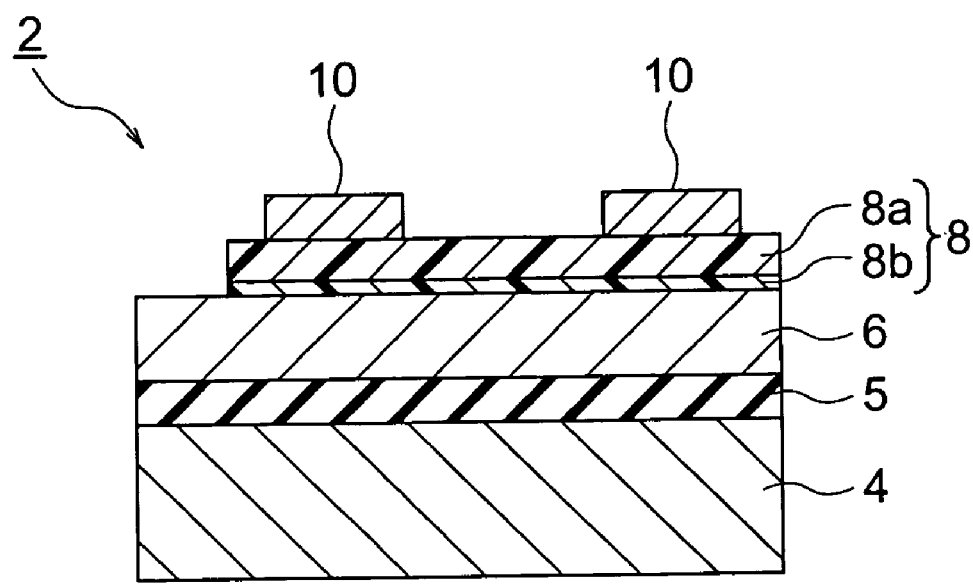

As shown in FIG. 1A, a thin film capacitor 2 according to an embodiment of the present invention has a substrate 4, and a lower portion electrode thin film 6 is formed on the substrate 4 via an insulation layer 5. A dielectric thin film (high-permittivity insulation film) 8 is formed on the lower portion electrode thin film 6. As shown in FIG. 1B, an upper portion electrode thin film 10 is formed on the dielectric thin film 8.

The substrate 4 is not particularly limited but composed of a single crystal having good lattice matching (for example, $SrTiO_3$ single crystal, MgO single crystal and $LaAlO_3$ single crystal, etc.), an amorphous material (for example, glass, fused silica and $SiO_2/Si$, etc.) and other material (for example, $ZrO_2/Si$ and $CeO_2/Si$, etc.), etc. A thickness of the substrate 4 is not particularly limited and is, for example, 100 to 1000 μm or so.

In the present embodiment, a silicon monocrystal substrate is used as the substrate 4, an insulation layer 5 composed of a thermally-oxidized film (silicon oxidized film) is formed on a surface thereof, and a lower portion electrode thin film 6 is formed on the surface. A material for forming the lower portion electrode thin film 6 is not particularly limited as far as it has conductivity, and the lower portion electrode thin film 6 may be formed by using platinum (Pt), ruthenium (Ru), rhodium (Rh), palladium (Pd), iridium (Ir), gold (Au), silver (Ag), copper (Cu), nickel (Ni) and other metal, alloys containing these as a main component, and a conductive oxide having a perovskite structure, such as $SrRuO_3$, $CaRuO_3$, $SrVO_3$, $SrCrO_3$, $SrCoO_3$, $LaNiO_3$ and Nb dope $SrTiO_3$, and a mixture of these.

The lower portion electrode thin film in the case of using an amorphous material as the substrate 4 may be composed, for example, of ITO and other conductive glass.

By placing a second bismuth layer-structured compound on a surface of the power portion electrode 6, it is possible to produce a dielectric film having a high c-axis orientation degree extremely easily even in the case of using an amorphous electrode, non-oriented electrode and an electrode oriented to other direction than the [001] direction (for example, [111] direction) as well as in the case of a lower portion electrode oriented to [001] direction.

A thickness of the lower portion electrode thin film 6 is not particularly limited, but is preferably 10 to 1000 nm, and more preferably 50 to 200 nm or so.

The upper electrode thin film 10 may be composed of the same material as that of the lower portion electrode thin film 6. A thickness thereof may be also same as that of the lower portion electrode thin film 6.

The dielectric thin film 8 is composed of a multilayer film of a first bismuth layer-structured compound layer 8a and a second bismuth layer-structured compound layer 8b. The second bismuth layer-structured compound layer 8b is formed between the first bismuth layer-structured compound layer 8a and the lower portion electrode thin film 6 and has a function as a buffer layer of them.

The first bismuth layer-structured compound layer 8a includes a bismuth layer-structured compound expressed by a composition formula of $(Bi_2O_2)^{2+}(Am_{m-1} B_m O_{3m+1})^{2-}$ or $Bi_2 A_{m-1} B_m O_{3m+3}$. Generally, a bismuth layer-structured compound has a layered configuration that a layered perovskite layer, wherein perovskite lattices composed of $ABO_3$ are connected, is sandwiched by a pair of layers of Bi and O.

In the above formula, "m" is not particularly limited as far as it is a positive number and may be an odd number or an even number. Note that when "m" is an even number, the reflection plane becomes parallel with a c-plane, so that the reflection plane works as a mirror and c-axis direction components of an intrinsic polarization cancel each other, consequently, there is not a polarization axis in the c-axis direction. Therefore, a paraelectric property is maintained to improve the temperature characteristics of permittivity and a low loss (tan δ is low) is realized. Also, when "m" is an odd number, a polarization axis is obtained also in the c-axis direction and a permittivity at the Curie's point becomes higher than that in the case where "m" is an even number. Note that, in the present embodiment, "m" is 3, 4 or 5 because of easiness in production.

In the above formula, "A" is composed of at least one element selected from Na, K, Pb, Ba, Sr, Ca and Bi. Note that when "A" is composed of two or more elements, ratios thereof may be any.

In the above formula, "B" is composed of at least one element selected from Fe, Co, Cr, Ga, Ti, Nb, Ta, Sb, V, Mo, W and Mn. Note that when "B" is composed of two or more elements, ratios thereof may be any.

In the present embodiment, the second bismuth layer-structured compound layer 8b is composed of a bismuth layer-structured compound having the same stoichiometric composition as that of the first bismuth layer-structured compound layer 8a, but Bi in the second bismuth layer-structured compound layer 8b is included excessively comparing with that in the above composition formula of $(Bi_2O_2)^{2+}(A_{m-1} B_m O_{3m+1})^{2-}$ or $Bi_2 A_{m-1} B_m O_{3m+3}$. For example, an excessive quantity of bismuth included in the second bismuth layer-structured compound layer 8b is larger than 0, preferably 0.1 mole folds or larger and 0.5 mole folds or smaller, and more preferably 0.1 to 0.4 mole folds. When in such a range, a c-axis orientation degree of the second bismuth layer-structured compound layer 8b particularly improves, that of the first bismuth layer-structured compound layer 8a also improves, and a leakage resistant property of the dielectric thin film 8 as a whole improves.

For example, in the case of a bismuth layer-structured compound, wherein "m" above is 3, expressed by a composition formula of $Bi_4Ti_3O_{12}$, an excessive content of Bi therein is larger than 0, and preferably in a range of 0.1 mole folds or larger and 0.5 mole folds or smaller in terms of Bi.

Alternately, when expressing the bismuth layer-structured compound by a composition formula of $Bi_{4+\alpha}Ti_3O_{12}$, "α" as the number of moles of the excessive content of Bi in the bismuth layer-structured compound is larger than 0, and preferably in a range of 0.4 (0.1 mole folds)$\leq \alpha \leq 2.0$ (0.5 mole folds).

Alternately, in the case of a bismuth layer-structured compound, wherein "m" above is 4, expressed by a composition formula of $SrBi_4Ti_4O_{15}$ or $Sr_xCa_yBa_zBi_4Ti_4O_{15}$ (note that x+y+z=1, $0 \leq x \leq 1$, $0 \leq y \leq 1$ and $0 \leq z \leq 1$), the excessive quantity of Bi is larger than 0, and preferably in a range of 0.1 mole folds or larger and 0.5 mole folds or smaller in terms of Bi.

Alternately, when expressing the bismuth layer-structured compound by a composition formula of $SrBi_{4+\alpha}Ti_4O_{15}$ or $Sr_xCa_yBa_zBi_{4+\alpha}Ti_4O_{15}$ (note that x+y+z=1, $0 \leq x \leq 1$, $0 \leq y \leq 1$ and $0 \leq z \leq 1$), "α" as the number of moles of the excessive content of Bi in the bismuth layer-structured compound is larger than 0, and preferably in a range of 0.4 (0.1 mole folds)$\leq \alpha \leq 2.0$ (0.5 mole folds).

Furthermore, in the case of a bismuth layer-structured compound, wherein "m" above is 5, expressed by a composition formula of $Sr_2Bi_4Ti_5O_{18}$, the excessive quantity of Bi is larger than 0, and preferably in a range of 0.1 mole folds or larger and 0.5 mole folds or smaller in terms of Bi.

Alternately, when expressing the bismuth layer-structured compound by a composition formula of $Sr_2Bi_{4+\alpha}Ti_5O_{18}$, "α" as the number of moles of the excessive content of Bi in the bismuth layer-structured compound is larger than 0, and preferably in a range of 0.4 (0.1 mole folds)$\leq \alpha \leq 2.0$ (0.5 mole folds).

In the present embodiment, by including bismuth excessively in the second bismuth layer-structured compound layer 8b comparing with the stoichiometric composition, orientation to the [001] direction, that is, c-axis orientation in the bismuth layer-structured compound is intensified. Namely, the second bismuth layer-structured compound layer 8b is formed, so that the c-axis of the bismuth layer-structured compound is oriented vertically with respect to the substrate 4.

When the c-axis orientation degree of the second bismuth layer-structured compound layer 8b is intensified, the c-axis orientation degree of the first bismuth layer-structured compound layer 8a is also intensified. Note that when forming a 8a having a stoichiometric composition, wherein the bismuth is not excessive but the permittivity is excellent, directly on the surface of the lower portion electrode 6, the c-axis orientation degree declines and the leakage resistant property declines.

In the present invention, it is particularly preferable that the c-axis orientation degree of the bismuth layer-structured compound is 100%, but it does not always have to be 100%, and when preferably 80% or more, more preferably 90% or more and furthermore preferably 95% or more of the bismuth layer-structured compound is c-axis oriented, it is sufficient.

The c-axis orientation degree "F." of the bismuth layer-structured compound here is obtained by the formula (1) below.

$$F(\%)=(P-P0)/(1-P0)\times 100 \qquad (1)$$

In the formula (1), P0 is X-ray diffraction intensity P of a c-axis of polycrystal having a completely random orientation, that is, a ratio of a total $\Sigma I(001)$ of reflection intensity I(001) from a plane (001) of polycrystal having a completely random orientation and a total $\Sigma I(hk1)$ of reflection intensity I(hk1) from respective crystal surfaces (hk1) of the polycrystal, that is $(\{\Sigma I(001)/\Sigma I(hk1)\}$; and P is X-ray diffraction intensity P of a c-axis of a bismuth layer-structured compound, that is, a ratio of a total $\Sigma I(001)$ of reflection intensity I(001) from a plane (001) of the bismuth layer-structured compound and a total $\Sigma I(hk1)$ of reflection intensity I(hk1) from respective crystal surfaces (hk1) of the bismuth layer-structured compound, that is $(\{\Sigma I(001)/\Sigma I(hk1)\}$. Here, "h", "k" and "l" are any of 0 or larger integers, respectively.

Here, because P0 is a constant, when the total $\Sigma I(001)$ of reflection intensity I(001) from a plane (001) is equal to the total $\Sigma I(hk1)$ of reflection intensity I(hk1) from respective crystal surfaces (hk1), that is, when P=1, the c-axis orientation degree F. of an anisotropic material becomes 100%.

Note that the c-axis of the bismuth layer-structured compound means the direction of bonding a pair of $(Bi_2O_2)_{2+}$ layers, that is, the [001] direction.

In the present embodiment, due to the excessive inclusion of bismuth in the second bismuth layer-structured compound layer 8b, the c-axis orientation degree of the layer is improved and, moreover, that of the first bismuth layer-structured compound layer 8a formed thereon is also improved. As a result, the leakage resistant property in the dielectric thin film 8 improves. The dielectric thin film 8 also has the first bismuth layer-structured compound layer 8a close to the logical composition, wherein bismuth is not excessive, and the layer 8a has a higher permittivity than that of the layer 8b including excessive bismuth. As a result, the permittivity of the dielectric thin film as a whole is improved and the capacitance improves.

Accordingly, in the present embodiment, it is possible to provide a dielectric thin film 8 having a higher c-axis orientation degree and particularly excellent leakage current resistant property and, moreover, capable of improving the permittivity in total. Also, the dielectric thin film 8 exhibits a low loss (tan δ is low), and a Q (1/tan δ) value rises when the tan δ decreases.

The first bismuth layer-structured compound layer 8a and/or the second bismuth layer-structured compound layer 8b may furthermore include one or more element (rare earth element Re) selected from Sc, Y, La, Ce, Pr, Nd, Pm, Sm, Eu, Gd, Tb, Dy, Ho, Er, Tm, Yb and Lu. A substitution quantity by the rare earth element varies in accordance with an "m" value and, for example, when m=3, it is preferably $0.4 \leq x \leq 1.8$, and more preferably $1.0 \leq x \leq 1.4$ in the stoichiometric composition formula of $Bi_2A_{2-x}Re_xB_3O_{12}$. By substituting by the rare earth element in this range, the leakage property can be furthermore improved.

Note that the dielectric thin film 8 has an excellent leakage property without the rare earth element Re as will be explained later on, but the leakage property can be furthermore excellent by the Re substitution.

The dielectric thin film 8 composed of the first bismuth layer-structured compound layer 8a and the second bismuth layer-structured compound layer 8b has a film thickness in total of preferably 1 to 1000 nm and, in terms of attaining a higher capacity, 1 to 500 nm is more preferable.

Also, in the present embodiment, a thickness of the second bismuth layer-structured compound layer 8b is thinner than a thickness of the first bismuth layer-structured compound layer 8a. In this case, the thickness of the second bismuth layer-structured compound layer 8b is preferably 1 nm or thicker but not thicker than 300 nm, more preferably 5 to 200 nm, and particularly preferably 10 to 100 nm. The second bismuth layer-structured compound layer 8b functions as a buffer layer of the first bismuth layer-structured compound layer 8a and, when hen the thickness is too thin, a function of improving the c-axis orientation degree and improving the leakage resistant property tends to decline. While when the thickness of the second bismuth layer-structured compound layer 8b is too thick, the thickness of the first bismuth layer-structured compound layer 8a has to be thinner to respond to the demand for a thinner layer, and the permittivity in total tends to decline.

In the dielectric thin film 8, the permittivity at 25° C. (room temperature) and a measurement frequency of 100 kHz (AC 20 mV) is preferably higher than 100, and more preferably 150 or higher.

The first bismuth layer-structured compound layer 8a and the second bismuth layer-structured compound layer 8b can be respectively formed by a variety of thin film formation methods, such as a vacuum deposition method, sputtering method, pulse laser deposition (PLD) method, metal-organic chemical vapor deposition (MOCVD) method, metal-organic decomposition method and other liquid phase method (CSD method). Particularly when the dielectric thin film 8 has to be formed at a low temperature, a plasma CVD, optical CVD, laser CVD, optical CSD and laser CSD methods are preferably used.

In the present embodiment, the first bismuth layer-structured compound layer 8a and the second bismuth layer-structured compound layer 8b can be produced particularly by the method described below.

As shown in FIG. 2, a material solution for forming the second bismuth layer-structured compound layer 8b shown in FIG. 1 is fabricated first. For example, when the second bismuth layer-structured compound layer 8b is a bismuth layer-structured compound expressed by a stoichiometric composition formula of $SrBi_4Ti_4O_{15}$ and added with excessive bismuth, a toluene solution of 2-ethylhexanoate Sr, a 2-ethylhexanoate solution of 2-ethylhexanoate Bi, and a toluene solution of 2-ethylhexanoate Ti are prepared. Namely, Two of the solutions are mixed, so that the Bi adding quantity is increased by α mole comparing with that in the case of mixing them at the stoichiometric ratio, such as 1 mole of 2-ethyl hexanoate Sr, (4+α) moles of 2-ethyl hexanoate Bi and 4 moles of 2-ethyl hexanoate Ti, and the result is diluted by toluene, as a result, a material solution can be obtained.

Next, the material solution is applied on the lower portion electrode 6 shown in FIG. 1A. The coating method is not particularly limited and the spin-coating method, dip coating method, spray method and a method of painting with a brush, etc. may be used. For example, about 1 to 300 nm of a coating film can be formed by one-time coating. The coating film is dried in the air to evaporate a catalyst in the coating film as shown in FIG. 2. The drying temperature is from the room temperature to 400° C. or so.

Next, the coating film after drying is preliminarily fired (not to be crystallized) in an oxygen atmosphere. The preliminary firing temperature is 200 to 700° C. or so.

Note that the steps from coating to preliminary firing may be repeatedly performed on the coating film after preliminary firing for one time or more. Note that when a thickness of the coating film before firing is too thick, it is liable that a preferably crystallized c-axis oriented bismuth layer-structured compound film is hard to be obtained.

After that, main firing (also, simply referred to as "firing" or "crystallizing") is performed on the coating film. The main firing is performed under a temperature condition of crystallizing the coating film, which is preferably 700 to 900° C. An atmosphere of the main firing is not particularly limited and may be an oxygen gas atmosphere.

Note that the main firing after repeating the steps from coating to preliminary firing may be repeated for one or more times. Note that, at the time of the main firing, a thickness of the coating film before firing at one-time main firing is set, so that the film thickness after the one-time firing becomes preferably 200 nm or thinner, and more preferably 10 to 200 nm. When the thickness of the coating film before firing is too thick, it is liable that a preferably crystallized c-axis oriented bismuth layer-structured compound film is hard to be obtained after firing.

Next, as shown in FIG. 2, a material solution for forming the first bismuth layer-structured compound layer 8a shown in FIG. 1 is fabricated. A bismuth adding quantity of a logical composition formula, wherein bismuth is not excessive, is attained when fabricating the material. Other than that, the first bismuth layer-structured compound layer 8a is formed on the second bismuth layer-structured compound layer 8b in the same way as in the case of forming the second bismuth layer-structured compound layer 8b.

In the thus obtained 8b and the first bismuth layer-structured compound layer 8a, the c-axis is oriented vertically with respect to the substrate 4. The c-axis orientation degree of the bismuth layer-structured compounds is preferably 80% or higher, more preferably 90% or higher, and furthermore preferably 95% or higher.

After that, as shown in FIG. 1B, the upper electrode 10 is formed by the sputtering method, etc. and subjected to thermal treatment in $pO_2$=20 to 100% (oxygen partial pressure). The thermal treatment is performed preferably at 500 to 900° C.

The dielectric thin film 8 as above and a thin film capacitor 2 using the same have a relatively high permittivity, a low loss, excellent leakage resistant property, improved breakdown voltage, excellent temperature characteristics of permittivity and excellent surface smoothness.

Also, the dielectric thin film 8 as above and the thin film capacitor 2 are also excellent in the frequency characteristics and voltage characteristics.

Second Embodiment

In the present embodiment, a thin film multilayer capacitor, wherein the dielectric thin film is formed by multilayer, will be explained as an example of a thin film capacity element.

Figure 3:
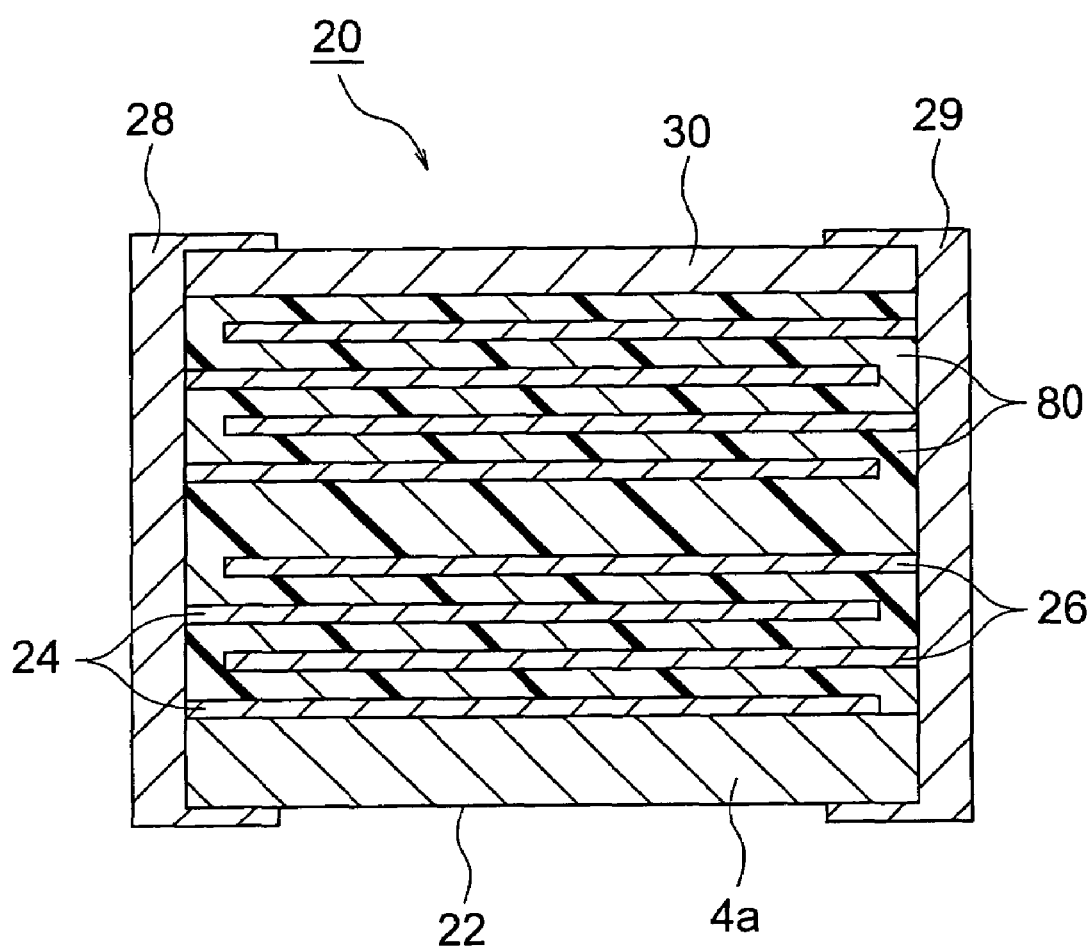
FIG. 3 is a schematic sectional view of a thin film capacitor according to another embodiment of the present invention.

As shown in FIG. 3, a thin film multilayer capacitor 20 according to an embodiment of the present invention has a capacitor element 22. The capacitor element 22 has a multilayer structure, wherein a plurality of dielectric thin films 80 and internal electrode thin films 24 and 26 are alternately arranged on a substrate 4a and a protective layer 30 is formed to cover the outermost arranged dielectric thin film 80. At both end portions of the capacitor element 22 are formed with a pair of external electrodes 28 and 29, and the pair of external electrodes 28 and 29 are electrically connected to exposed end surfaces of the plurality of internal electrode thin films 24 and 26 alternately arranged in the capacitor element 22 so as to configure a capacitor circuit. A shape of the capacitor element 22 is not particularly limited but normally rectangular parallelepiped. Also, a size thereof is not particularly limited and, for example, a length (0.01 to 10 mm)×width (0.01 to 10 mm)×height (0.01 to 1 mm) or so.

The substrate 4a is formed by the same material as that of the substrate 4 in the first embodiment explained above. Each of the dielectric thin films 80 has the same configuration as that of the dielectric thin film 8 in the first embodiment explained above.

The internal electrode thin films 24 and 26 are formed by the same material as that of the lower portion electrode thin film 6 and the upper portion electrode thin film 10 in the first embodiment. A material of the external electrodes 28 and 29 is not particularly limited and they are composed of $CaRuO_3$, $SrRuO_3$ and other conductive oxide; Cu, a Cu alloy, Ni, a Ni alloy or other base metal; Pt, Ag, Pd, an Ag—Pd alloy and other precious metal; etc. A thickness thereof is not particularly limited and may be, for example, 10 to 1000 nm or so. A material of the protective layer 30 is not particularly limited and it may be composed of, for example, a silicon oxide film and an aluminum oxide film, etc.

In the thin film multilayer capacitor 20, after forming a first internal electrode thin film 24 on the substrate 4a by using a mask, such as a metal mask, the dielectric thin film 80 is formed on the internal electrode thin film 24, then, a second internal electrode thin film 26 is formed on the dielectric thin film 80. After repeating such steps for a plurality of times, an outermost dielectric thin film 80 on the opposite side of the substrate 4a is covered with the protective film 30, so that the capacitor element 22, wherein a plurality of internal electrode thin films 24 and 26 and dielectric thin films 80 are alternately arranged on the substrate 4a, is formed. By covering with the protective film 30, an effect of moisture in the air on the inside of the capacitor element 22 can be suppressed. Also, when forming the external electrodes 28 and 29 on both end portions of the capacitor element 22 by dipping or sputtering, etc., internal electrode thin films 24 as odd layers are electrically connected to one of the external electrode 28, and internal electrode thin films 24 as even layers are electrically connected to the other external electrode 29, so that the thin film multilayer capacitor 20 is obtained.

In the present embodiment, it is preferable to use a substrate 4a composed of an amorphous material in terms of reducing the production cost.

The dielectric thin film 80 used in the present embodiment has a relatively high permittivity even when made to be thin and, moreover, has preferable surface smoothness, so that it is possible to increase the number of stacked layers to 20 or more, and preferably 50 or more. Therefore, a compact thin film multilayer capacitor 20 capable of giving a relatively high capacity can be provided.

In the thin film capacitor 2 and thin film multilayer capacitor 20 according to the present embodiment as explained above, it is preferable that an average change rate ($\Delta\epsilon$) of the permittivity against temperature in a range of at least −55 to +150° C. is within ±500 ppm/° C. (the reference temperature is 25° C.), and more preferably within ±300 ppm/° C.

Next, the present invention will be explained further in detail by taking more specific examples of the embodiment of the present invention. Note that the present invention is not limited to the examples.

EXAMPLE 1

As shown in FIG. 2, a material solution for forming the second bismuth layer-structured compound layer 8b shown in FIG. 1 was fabricated first. In the present example, to compose the second bismuth layer-structured compound layer 8b by a bismuth layer-structured compound expressed by a composition formula of $Bi_{4+\alpha}Ti_3O_{12}$ including bismuth in excess of that in a bismuth layer-structured compound expressed by a stoichiometric composition of $Bi_4Ti_3O_{12}$ (BiT) and a composition formula of $Bi_2A_{m-1}B_mO_{3m+3}$, wherein m=3, $A_2$=$Bi_2$ and $B_3$=$Ti_3$, a solution below was prepared.

First, a 2-ethylhexanoate solution of 2-ethylhexanoate Bi, and a toluene solution of 2-ethylhexanoate Ti were prepared as material solutions. Namely, the two solutions were mixed, so that the Bi adding quantity was increased by $\alpha$ mole comparing with that in the case of mixing them at the stoichiometric ratio, such as (4+$\alpha$) moles of 2-ethyl hexanoate Bi and 3 moles of 2-ethyl hexanoate Ti, and the result was diluted by toluene, as a result, a material solution was obtained.

Some kinds of material solutions were prepared, wherein the "$\alpha$" indicating an excessive content of Bi was changed to 0, 0.4 (0.1 mole folds), 0.8 (0.2 mole folds), 1.2 (0.3 mole folds), 1.6 (0.4 mole folds) and 2.0 (0.5 mole folds). These kinds of material solutions were diluted with toluene, so that $Bi_4Ti_3O_{12}$ in the stoichiometric composition was included in the material solution at concentration of 0.1 mol/litter. Each of the material solutions was filtrated by a syringe filter having an aperture diameter of 0.2 μm made by PTFE in a clean room and put in a glass container cleaned in a clean room.

Also, a material solution for forming the first bismuth layer-structured compound layer 8a was prepared in the same way as the material solution for forming the first bismuth layer-structured compound layer 8a explained above except for attaining α=0.

Furthermore, the substrate 4 was prepared separately from the material solutions. The substrate 4 was a silicon single crystal (100) substrate, and an insulation layer 5 as a silicon oxide film was formed on a surface of the substrate 4 by thermal oxidization processing. A thickness of the insulation layer 5 was 0.5 μm. On a surface of the insulation layer 5, a lower portion electrode 6 formed by a Pt thin film was formed to be a thickness of 0.1 μm by the sputtering method. An area of the substrate 4 was 5 mm×10 mm.

The substrate 4 was prepared by the number of the kinds of the material solutions, and each of them was set to a spin coater. The material solution for forming the second bismuth layer-structured compound layer 8b was added by 10 μ litter on the surface of the substrate 4, and spin-coated under a condition of 4000 rpm for 20 seconds, so that a coating film was formed on the surface of the lower portion electrode 6. To evaporate a catalyst of each coating film, the substrate 4 was placed in a constant chamber (the inside is the air) set at 150° C. and dried for 10 minutes. After 10 minutes, the substrate 4 was taken out and, as shown in FIG. 1A, a part of the coating film for forming the second bismuth layer-structured compound layer 8b was removed, so that a part of the surface of the lower portion electrode 6 was exposed.

Next, to perform preliminary firing on the coating film, each substrate 4 was placed in a ring furnace. In the ring furnace, oxygen was flowing at 0.3 litter/minute, the temperature was raised to 400° C. at the temperature rising rate of 10° K/minute, held at 400° C. for 10 minutes, then, the temperature was lowered at the temperature lowering rate of 10° K/minute. The preliminary firing was performed under a temperature condition of not crystallizing the coating film.

Next, to perform main firing on the preliminarily fired film, each substrate was placed in a ring furnace. In the ring furnace, oxygen was flowing at 5 milliliter/minute, the temperature was raised to 850° C. at the temperature rising rate of 80° K/minute, held at 850° C. for 30 minutes, then, the temperature was lowered at the temperature lowering rate of 80° K/minute, so that the second bismuth layer-structured compound layer 8b was obtained. The second bismuth layer-structured compound layer 8b after the main firing was made to have some kinds of film thicknesses as shown in Table 1 below.

After that, on the second bismuth layer-structured compound layer 8b after the main firing, the first bismuth layer-structured compound layer 8a was formed by repeating coating, drying, preliminary firing and main firing again under the same condition as that of the second bismuth layer-structured compound layer 8b explained above except that bismuth is not excessive. A film thickness of the first bismuth layer-structured compound layer 8a after main firing was 300 nm.

When X-ray diffraction (XRD) measurement was made on the crystal structure of the second bismuth layer-structured compound layer 8b and the first bismuth layer-structured compound layer 8a, it was confirmed to be oriented in the [001] direction, that is c-axis oriented being vertically with respect to the surface of the silicon single crystal substrate 4. Also, a c-axis orientation degree F. (%) of each compound layer was obtained. The c-axis orientation degree (%) was obtained from the measured XRD pattern by using the Lottgering method in a range of 10 to 35 degrees. The results are shown in Table 1.

Next, on a surface of each of the dielectric thin films 8 composed of the first bismuth layer-structured compound layer 8a and the second bismuth layer-structured compound layer 8b, as shown in FIG. 1B, a Pt upper portion electrode 10 having 0.1 mmø was formed by the sputtering method, so that a plurality of kinds of thin film capacitor samples were produced.

Electric characteristics (a permittivity, tan δ, loss Q value, leakage current and short-circuiting rate) and temperature characteristics of permittivity of the obtained capacitor samples were evaluated.

The permittivity (no unit) was calculated for each capacitor sample from a capacitance measured under a condition at the room temperature (25° C.) and a measurement frequency of 100 kHz (AC 20 mV) by using an impedance analyzer (HP4194A), and an electrode size and distance between electrodes of the capacitor sample.

The leakage current resistant property (unit: A/cm$^2$) was measured at an electric field intensity of 50 kV/cm.

The results are shown in Table 1. Note that the first bismuth layer-structured compound layer is abbreviated to a first layer, the second bismuth layer-structured compound layer is abbreviated to a second layer, and the main firing temperature is abbreviated to T2 in Table 1.

TABLE 1

| | | | | m = 3 | | | | | |
|---|---|---|---|---|---|---|---|---|---|
| Excessive Bi Quantity (mole folds) | Second Layer α Composition | T2 (° C.) | Second Layer Film Thickness (nm) | Second Layer Orientation Degree (%) | First Layer Composition | First Layer Film Thickness (nm) | First Layer Orientation Degree (%) | Permittivity | Leakage Current (A/cm$^2$) |
| 0 | 0 Bi4Ti3O12 | 850 | 20 | 30 | Bi4Ti3O12 | 300 | 10 | 150 | $1 * 10^{-6}$ |
| 0.1 | 0.4 Bi4·4Ti3O12 | 850 | 5 | 80 | ↑ | 300 | 80 | 140 | $1 * 10^{-7}$ |
| | | 850 | 20 | 95 | ↑ | 300 | 95 | 135 | $1 * 10^{-8}$ |
| | | 850 | 100 | 80 | ↑ | 300 | 80 | 135 | $1 * 10^{-8}$ |
| | | 850 | 300 | 60 | ↑ | 300 | 50 | 125 | $5 * 10^{-6}$ |
| 0.2 | 0.8 Bi4·8Ti3O12 | 850 | 20 | 100 | ↑ | 300 | 96 | 135 | $1 * 10^{-8}$ |
| | | 850 | 100 | 100 | ↑ | 300 | 95 | 135 | $1 * 10^{-8}$ |
| 0.3 | 1.2 Bi5·2Ti3O12 | 850 | 20 | 100 | ↑ | 300 | 98 | 130 | $1 * 10^{-8}$ |
| | | 850 | 100 | 100 | ↑ | 300 | 96 | 130 | $1 * 10^{-8}$ |

TABLE 1-continued m = 3

| Excessive Bi Quantity (mole folds) | Second Layer α Composition | T2 (° C.) | Second Layer Film Thickness (nm) | Second Layer Orientation Degree (%) | First Layer Composition | First Layer Film Thickness (nm) | First Layer Orientation Degree (%) | Permittivity | Leakage Current (A/cm²) |
|---|---|---|---|---|---|---|---|---|---|
| 0.4 | 1.6 Bi5•6Ti3O12 | 850 | 20 | 90 | ↑ | 300 | 98 | 125 | $1 * 10^{-8}$ |
|  |  | 850 | 100 | 90 | ↑ | 300 | 96 | 125 | $1 * 10^{-8}$ |
|  |  | 850 | 300 | 65 | ↑ | 300 | 65 | 125 | $5 * 10^{-6}$ |
| 0.5 | 2.0 Bi6Ti3O12 | 850 | 20 | 70 | ↑ | 300 | 70 | 100 | $1 * 10^{-6}$ |
|  |  | 850 | 100 | 70 | ↑ | 300 | 70 | 100 | $1 * 10^{-6}$ |

As shown in Table 1, it was confirmed that when the Bi excessive content in the second bismuth layer-structured compound layer 8b was larger than 0, preferably 0.1 mole folds or larger but not larger than 0.5 mole folds, and more preferably 0.1 to 0.4 mole folds, the c-axis orientation degree was improved, the leakage current was a little, and the leakage resistant property was excellent, while the permittivity was not deteriorated.

Also, as shown in Table 1, it was confirmed that when the thickness of the second bismuth layer-structured compound layer was thinner than the thickness of the first bismuth layer-structured compound layer and the thickness of the second bismuth layer-structured compound layer was 1 nm or thicker but thinner than 300 nm, more preferably 5 to 200 nm, and particularly preferably 20 to 200 nm, the c-axis orientation degree was improved, the leakage current was a little, and the leakage resistant property was excellent, while the permittivity was not deteriorated.

EXAMPLE 2

In the present example, except that the first bismuth layer-structured compound layer 8a was composed of a bismuth layer-structured compound expressed by a stoichiometric composition formula of $SrBi_4Ti_4O_{15}$ (SBTi) and a composition formula of $Bi_2A_{m-1}B_mO_{3m+3}$, wherein m=4, $A_3$=Sr+$Bi_2$ and $B_4$=$Ti_4$, and the second bismuth layer-structured compound layer 8b was composed of a bismuth layer-structured compound expressed by a composition formula of $SrBi_{4+\alpha}Ti_4O_{15}$ including excessive bismuth, capacitor samples were produced in the same way as in the example 1, and the same tests as those in the example 1 were conducted. The results are shown in Table 2.

As shown in Table 2, it was confirmed that when the Bi excessive content in the second bismuth layer-structured compound layer 8b was larger than 0, preferably 0.1 mole folds or larger but not larger than 0.5 mole folds, and more preferably 0.1 to 0.4 mole folds, the c-axis orientation degree was improved, the leakage current was a little, and the leakage resistant property was excellent, while the permittivity was not deteriorated.

Also, as shown in Table 2, it was confirmed-that when the thickness of the second bismuth layer-structured compound layer was thinner than the thickness of the first bismuth layer-structured compound layer and the thickness of the second bismuth layer-structured compound layer was 1 nm or thicker but thinner than 300 nm, more preferably 5 to 200 nm, and particularly preferably 20 to 200 nm, the c-axis orientation degree was improved, the leakage current was a little, and the leakage resistant property was excellent, while the permittivity was not deteriorated.

EXAMPLE 3

In the present example, except that the first bismuth layer-structured compound layer 8a was composed of a bismuth layer-structured compound expressed by a stoichiometric composition formula of $Sr_2Bi_4Ti_5O_{18}$ and a composition formula of $Bi_2A_{m-1}B_mO_{3m+3}$, wherein m=5, $A_4$=$Sr_2$+$Bi_2$ and $B_5$=$Ti_5$, and the second bismuth layer-structured compound layer 8b was composed of a bismuth layer-structured compound expressed by a composition formula of $Sr_2Bi_{4+\alpha}Ti_5O_{18}$ including excessive bismuth, capacitor samples were produced in the same way as in the example 1, and the same tests as those in the example 1 were conducted. The results are shown in Table 3.

TABLE 2 m = 4

| Excessive Bi Quantity (mole folds) | Second Layer α Composition | T2(° C.) | Second Layer Film Thickness (nm) | Second Layer Orientation Degree (%) | First Layer Composition | First Layer Film Thickness (nm) | First Layer Orientation Degree (%) | Permittivity | Leakage Current (A/cm²) |
|---|---|---|---|---|---|---|---|---|---|
| 0 | 0 SrBi4Ti4O15 | 850 | 20 | 30 | SrBi4Ti4O15 | 300 | 25 | 225 | $5 * 10^{-6}$ |
| 0.1 | 0.4 SrBi4•4Ti4O15 | 850 | 20 | 84 | ↑ | 300 | 80 | 200 | $1 * 10^{-8}$ |
|  |  | 850 | 100 | 91 | ↑ | 300 | 84 | 225 | $1 * 10^{-8}$ |
|  |  | 850 | 300 | 64 | ↑ | 300 | 55 | 210 | $8 * 10^{-6}$ |
| 0.2 | 0.8 SrBi4•8Ti4O15 | 850 | 20 | 85 | ↑ | 300 | 80 | 206 | $1 * 10^{-8}$ |
|  |  | 850 | 100 | 95 | ↑ | 300 | 92 | 210 | $1 * 10^{-8}$ |
|  |  | 850 | 300 | 75 | ↑ | 300 | 60 | 205 | $8 * 10^{-6}$ |
| 0.3 | 1.2 SrBi5•2Ti4O15 | 850 | 100 | 97 | ↑ | 300 | 95 | 200 | $1 * 10^{-8}$ |
| 0.4 | 1.6 SrBi5•6Ti4O15 | 850 | 100 | 98 | ↑ | 300 | 95 | 190 | $1 * 10^{-8}$ |
| 0.5 | 2.0 SrBi6•0Ti4O15 | 850 | 100 | 70 | ↑ | 300 | 50 | 178 | $5 * 10^{-6}$ |

TABLE 3 m = 5

| Excessive Bi Quantity (mole folds) | Second Layer α Composition | T2(° C.) | Second Layer Film Thickness (nm) | Second Layer Orientation Degree (%) | First Layer Composition | First Layer Film Thickness (nm) | First Layer Orientation Degree (%) | Permittivity | Leakage Current (A/cm²) |
|---|---|---|---|---|---|---|---|---|---|
| 0 | 0 Sr2Bi4Ti5O18 | 850 | 20 | 20 | Sr2Bi4Ti5O18 | 300 | 15 | 320 | 5 * 10⁻⁶ |
| 0.1 | 0.4 Sr2Bi4•4Ti5O18 | 850 | 5 | 90 | ↑ | 300 | 90 | 320 | 1 * 10⁻⁸ |
| | | 850 | 20 | 85 | ↑ | 300 | 85 | 315 | 1 * 10⁻⁸ |
| | | 850 | 100 | 85 | ↑ | 300 | 83 | 315 | 1 * 10⁻⁸ |
| | | 850 | 200 | 82 | ↑ | 300 | 80 | 300 | 1 * 10⁻⁸ |
| | | 850 | 300 | 50 | ↑ | 300 | 40 | 300 | 7 * 10⁻⁶ |
| 0.2 | 0.8 Sr2Bi4•8Ti5O18 | 850 | 5 | 90 | ↑ | 300 | 90 | 310 | 1 * 10⁻⁸ |
| | | 850 | 20 | 90 | ↑ | 300 | 90 | 310 | 1 * 10⁻⁸ |
| | | 850 | 100 | 85 | ↑ | 300 | 85 | 312 | 1 * 10⁻⁸ |
| | | 850 | 300 | 60 | ↑ | 300 | 40 | 300 | 7 * 10⁻⁶ |
| 0.3 | 1.2 Sr2Bi5•2Ti5O18 | 850 | 20 | 95 | ↑ | 300 | 93 | 290 | 1 * 10⁻⁸ |
| | | 850 | 100 | 94 | ↑ | 300 | 93 | 295 | 1 * 10⁻⁸ |
| | | 850 | 300 | 60 | ↑ | 300 | 45 | 285 | 5 * 10⁻⁶ |
| 0.4 | 1.6 Sr2Bi5•6Ti5O18 | 850 | 20 | 97 | ↑ | 300 | 95 | 280 | 1 * 10⁻⁸ |
| | | 850 | 100 | 95 | ↑ | 300 | 95 | 280 | 1 * 10⁻⁸ |
| | | 850 | 300 | 60 | ↑ | 300 | 40 | 250 | 7 * 10⁻⁶ |
| 0.5 | 2.0 Sr2Bi6•0Ti5O18 | 850 | 100 | 65 | ↑ | 300 | 50 | 260 | 1 * 10⁻⁶ |
| | | 850 | 300 | 60 | ↑ | 300 | 45 | 240 | 5 * 10⁻⁶ |

As shown in Table 3, it was confirmed that when the Bi excessive content in the second bismuth layer-structured compound layer 8b was larger than 0, preferably 0.1 mole folds or larger but not larger than 0.5 mole folds, and more preferably 0.1 to 0.4 mole folds, the c-axis orientation degree was improved, the leakage current was a little, and the leakage resistant property was excellent, while the permittivity was not deteriorated.

Also, as shown in Table 3, it was confirmed that when the thickness of the second bismuth layer-structured compound layer was thinner than the thickness of the first bismuth layer-structured compound layer and the thickness of the second bismuth layer-structured compound layer was 1 nm or thicker but thinner than 300 nm, more preferably 5 to 200 nm, and particularly preferably 10 to 100 nm, the c-axis orientation degree was improved, the leakage current was a little, and the leakage resistant property was excellent, while the permittivity was not deteriorated.

As explained above, according to the present invention, it is possible to provide a high-permittivity insulation film, a thin film capacity element, a thin film multilayer capacitor and a production method of the thin film capacitor element, wherein a c-axis orientation is high, leakage current resistant property is particularly excellent, and the permittivity as a whole can be improved.

The invention claimed is:

1. A high-permittivity insulation film, comprising at least a first bismuth layer-structured compound layer expressed by a composition formula of $(Bi_2O_2)^{2+}(A_{m-1} B_m O_{3m+1})^{2-}$ or $Bi_2 A_{m-1} B_m O_{3m+3}$, wherein "m" is 4 or 5, "A" is at least one element selected from Na, K, Pb, Ba, Sr, Ca and Bi, and "B" is at least one element selected from Fe, Co, Cr, Ga, Ti, Nb, Ta, Sb, V, Mo, W and Mn, and a second bismuth layer-structured compound layer to be stacked with said first bismuth layer-structured compound layer, including bismuth in excess of that in said composition formula of said first bismuth layer-structured compound layer, wherein a thickness of said second bismuth layer-structured compound layer is thinner than a thickness of said first bismuth layer-structured compound layer.

2. The high-permittivity insulation film as set forth in claim 1, wherein an excessive quantity of bismuth included in said second bismuth layer-structured compound layer is 0.1 mole folds or larger and 0.5 mole folds or smaller of said composition formula of said first bismuth layer-structured compound layer.

3. The high-permittivity insulation film as set forth in claim 1, wherein a thickness of said second bismuth layer-structured compound layer is 1 nm or thicker and thinner than 300 nm.

4. The high-permittivity insulation film as set forth in claim 1, wherein a c-axis orientation degree of said second bismuth layer-structured compound layer is 80% or higher.

5. The high-permittivity insulation film as set forth in claim 1, wherein a c-axis orientation degree of said first bismuth layer-structured compound layer is 80% or higher.

6. The high-permittivity insulation film as set forth in claim 1, wherein said second bismuth layer-structured compound layer is composed of a plurality of layers having different bismuth excessive quantities.

7. The high-permittivity insulation film as set forth in claim 1, wherein said second bismuth layer-structured compound layer is composed of layers having a gradually changing bismuth excessive quantity along the layer thickness direction.

8. A thin film capacity element, wherein a lower portion electrode, a dielectric thin film and an upper portion electrode are formed successively on a substrate, wherein said dielectric thin film is composed of the high-permittivity insulation film as set forth in claim 1.

9. The thin film capacity element as set forth in claim 8, wherein said second bismuth layer-structured compound layer is stacked on a surface of said lower portion electrode, and said first bismuth layer-structured compound layer is stacked on a surface of said second bismuth layer-structured compound layer.

10. The thin film capacity element as set forth in claim 8, wherein a c-axis in said second bismuth layer-structured compound layer is oriented vertically with respect to the surface of said lower portion electrode.

11. The thin film capacity element as set forth in claim 8, where in a thickness of said dielectric thin film is 1 to 1000 nm.

12. A production method of the thin film capacity element as set forth in claim 8, including the steps of:
forming said second bismuth layer-structured compound layer on a surface of said lower portion electrode; and
forming said first bismuth layer-structured compound layer on a surface of said second bismuth layer-structured compound layer,
wherein a solution for composing said second bismuth layer-structured compound layer is applied on a surface of said lower portion electrode to form a coating film, so that a content of Bi in said bismuth layer-structured compound becomes excessive; then, said coating film is fired to form said second bismuth layer-structured compound layer; after that, said first bismuth layer-structured compound layer is formed.

13. The production method of the thin film capacity element as set forth in claim 12, wherein after forming said coating film on a surface of said lower portion electrode, said coating film is dried, then, said coating film is preliminarily fired at a temperature of not crystallizing the coating film, after that, said coating film is fired at 700 to 900° C., which is a temperature of crystallizing said coating film.

14. A thin film multilayer capacitor, wherein a plurality of dielectric thin films and internal electrode thin films are alternately stacked on a substrate, wherein
said dielectric thin film is composed of the high-permittivity insulation film as set forth in claim 1.

15. The thin film multilayer capacitor as set forth in claim 14, wherein
said second bismuth layer-structured compound layer is stacked on a surface of said lower portion electrode, and said first bismuth layer-structured compound layer is stacked on a surface of said second bismuth layer-structured compound layer,
a c-axis in said second bismuth layer-structured compound layer is oriented vertically with respect to the surface of said lower portion electrode thin film, and
a thickness of said dielectric thin film is 1 to 1000 nm.

16. A high-permittivity insulation film, comprising at least a first bismuth layer-structured compound layer expressed by a composition formula of $(Bi_2O_2)^{2+}(A_{m-1} B_m O_{3m+1})^{2-}$ or $Bi_2 A_{m-1} B_m O_{3m+3}$, wherein "m" is 4 or 5, "A" is at least one element selected from Na, K, Pb, Ba, Sr, Ca and Bi, and "B" is at least one element selected from Fe, Co, Cr, Ga, Ti, Nb, Ta, Sb, V, Mo, W and Mn, and
a second bismuth layer-structured compound layer to be stacked with said first bismuth layer-structured compound layer, including bismuth in excess of that in said composition formula of said first bismuth layer-structured compound layer,
wherein an excessive quantity of bismuth included in said second bismuth layer-structured compound layer is 0.1 mole folds or larger and 0.5 mole folds or smaller of said composition formula of said first bismuth layer-structured compound layer.

17. The high-permittivity insulation film as set forth in claim 16, wherein a c-axis orientation degree of said second bismuth layer-structured compound layer is 80% or higher.

18. The high-permittivity insulation film as set forth in claim 16, wherein a c-axis orientation degree of said first bismuth layer-structured compound layer is 80% or higher.

19. The high-permittivity insulation film as set forth in claim 16, wherein
said second bismuth layer-structured compound layer is composed of a plurality of layers having different bismuth excessive quantities, and
said second bismuth layer-structured compound layer is composed of layers having a gradually changing bismuth excessive quantity along the layer thickness direction.

20. A thin film capacity element, wherein a lower portion electrode, a dielectric thin film and an upper portion electrode are formed successively on a substrate, wherein
said dielectric thin film is composed of the high-permittivity insulation film as set forth in claim 16.

21. The thin film capacity element as set forth in claim 20, wherein
said second bismuth layer-structured compound layer is stacked on a surface of said lower portion electrode, and said first bismuth layer-structured compound layer is stacked on a surface of said second bismuth layer-structured compound layer,
a c-axis in said second bismuth layer-structured compound layer is oriented vertically with respect to the surface of said lower portion electrode, and
a thickness of said dielectric thin film is 1 to 1000 nm.

22. A production method of the thin film capacity element as set forth in claim 20, including the steps of:
forming said second bismuth layer-structured compound layer on a surface of said lower portion electrode; and
forming said first bismuth layer-structured compound layer on a surface of said second bismuth layer-structured compound layer,
wherein a solution for composing said second bismuth layer-structured compound layer is applied on a surface of said lower portion electrode to form a coating film, so that a content of Bi in said bismuth layer-structured compound becomes excessive; then, said coating film is fired to form said second bismuth layer-structured compound layer; after that, said first bismuth layer-structured compound layer is formed.

23. The production method of the thin film capacity element as set forth in claim 22, wherein after forming said coating film on a surface of said lower portion electrode, said coating film is dried, then, said coating film is preliminarily fired at a temperature of not crystallizing the coating film, after that, said coating film is fired at 700 to 900° C., which is a temperature of crystallizing said coating film.

24. A thin film multilayer capacitor, wherein a plurality of dielectric thin films and internal electrode thin films are alternately stacked on a substrate, wherein
said dielectric thin film is composed of the high-permittivity insulation film as set forth in claim 16.

25. The thin film multilayer capacitor as set forth in claim 24, wherein
said second bismuth layer-structured compound layer is stacked on a surface of said lower portion electrode, and said first bismuth layer-structured compound layer is stacked on a surface of said second bismuth layer-structured compound layer,
a c-axis in said second bismuth layer-structured compound layer is oriented vertically with respect to the surface of said lower portion electrode thin film, and
a thickness of said dielectric thin film is 1 to 1000 nm.

* * * * *